United States Patent
Chen et al.

(10) Patent No.: US 7,701,042 B2
(45) Date of Patent: Apr. 20, 2010

(54) INTEGRATED CIRCUIT PACKAGE SYSTEM FOR CHIP ON LEAD

(75) Inventors: Shao Jian Chen, Shanghai (CN); Wei Qiang Jin, Shanghai (CN); Bhoy Ching, Shanghai (CN); Taw Ming Lau, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/856,879

(22) Filed: Sep. 18, 2007

(65) Prior Publication Data

US 2008/0073781 A1 Mar. 27, 2008

Related U.S. Application Data

(60) Provisional application No. 60/825,997, filed on Sep. 18, 2006, provisional application No. 60/869,109, filed on Dec. 7, 2006.

(51) Int. Cl.
*H01L 23/495* (2006.01)
(52) U.S. Cl. .............................. 257/666; 257/E21.502

(58) Field of Classification Search ......... 257/666–675, 257/E21.502; 438/123
See application file for complete search history.

(56) References Cited

U.S. PATENT DOCUMENTS

| | | | |
|---|---|---|---|
| 6,100,581 A | 8/2000 | Wakefield et al. | |
| 6,159,764 A | 12/2000 | Kinsman et al. | |
| 6,346,152 B1 | 2/2002 | Moden et al. | |
| 6,956,282 B1* | 10/2005 | Alvarez et al. | 257/666 |
| 7,125,749 B2 | 10/2006 | Kinsman et al. | |
| 7,148,080 B2 | 12/2006 | Kim et al. | |
| 7,235,431 B2 | 6/2007 | Wood et al. | |
| 2005/0145998 A1* | 7/2005 | Harnden et al. | 257/666 |
| 2005/0236698 A1 | 10/2005 | Ozawa et al. | |
| 2006/0267184 A1 | 11/2006 | Kinsman et al. | |
| 2007/0187805 A1* | 8/2007 | Lee et al. | 257/666 |

* cited by examiner

*Primary Examiner*—Nathan W Ha
(74) *Attorney, Agent, or Firm*—Mikio Ishimaru

(57) ABSTRACT

An integrated circuit package system includes providing an integrated circuit die having planar dimensions; forming a lead extended across one of the planar dimensions of the integrated circuit die; and applying an adhesive layer over the lead of a side opposite the integrated circuit die.

20 Claims, 3 Drawing Sheets

INTEGRATED CIRCUIT PACKAGE SYSTEM FOR CHIP ON LEAD

CROSS-REFERENCE TO RELATED APPLICATION(S)

This application claims the benefit of U.S. Provisional application No. 60/825,997 filed Sep. 18, 2006, and U.S. Provisional application No. 60/869,109 filed Dec. 7, 2006.

TECHNICAL FIELD

The present invention relates generally to integrated circuit systems, and more particularly to a system for integrated circuit package for chip on lead.

BACKGROUND ART

Integrated circuits have become an integral part of our daily live particularly in many portable electronic products such as cell phones, portable computers, voice recorders, etc. Integrated circuits are also in many larger electronic systems, such as cars, planes, industrial control systems, etc. Across virtually all applications, there continues to be demand for reducing size and increasing performance of electronic devices.

Consumer demand for smaller, cheaper, faster electronic products directly affects packaging of integrated circuits. Increasing demand across virtually all aspects of modern life is driving improvements in integrated circuit technology. Generally, an electronic package is defined as the case and interconnection for integrated circuits also referred to as 'semiconductor device', 'chip' or 'die'.

The case and interconnection can form an electronic system that can provide interfacing and integration with a next level electronic system. The electronic package should provide a structure physically supporting the integrated circuit and protecting the integrated circuit from the environment, a means for removing heat generated by the integrated circuits or system, and/or electrical connections to provide signal and power access to and from the integrated circuit.

The integrated circuit is electrically connected to the electronic package through several technologies such as wire bonds, solder bumps, planar interconnect, tape connections, etc. One of the more mature and well-developed technologies is wire bonding. The maturity and extensive development contributes to typically lower cost including low cost materials and high yield for a large percentage of usable parts.

Wire bonding technology has been one of the most common techniques used to make electrical connections within the package. Wire bonding may employ gold, aluminum, or copper wires. A wire is typically bonded at one end to the integrated circuit and at the other end to a next-level system such as a substrate, a lead frame, a printed circuit board, a ceramic substrate, or a flexible circuit board.

The integrated circuit can include bond pads for the wire bonding connections. As market trends demand more functions in smaller form factors, packaging can require finer bond pad pitches or spacing, smaller bond pads, or bond pads limited to placement on only some edges of the integrated circuits.

Across virtually all applications, there continues to be growing demand for increasing capacity and increasing performance of integrated circuits. The seemingly endless restrictions and requirements are no more visible than with products in our daily lives. Smaller and denser integrated circuits are expected in many portable electronic products as well as in many larger electronic systems.

As the demand continues to grow for smaller electronic products with more features, manufacturers are seeking ways to include more capacity within the same product dimensional form factors.

Thus, a need still remains for an integrated circuit package system to provide improved capacity and manufacturing yield within smaller form factors. In view of the increasing demand for improved integrated circuits and particularly more capacity in small products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit die having planar dimensions; forming a lead extended across one of the planar dimensions of the integrated circuit die; and applying an adhesive layer over the lead of a side opposite the integrated circuit die.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
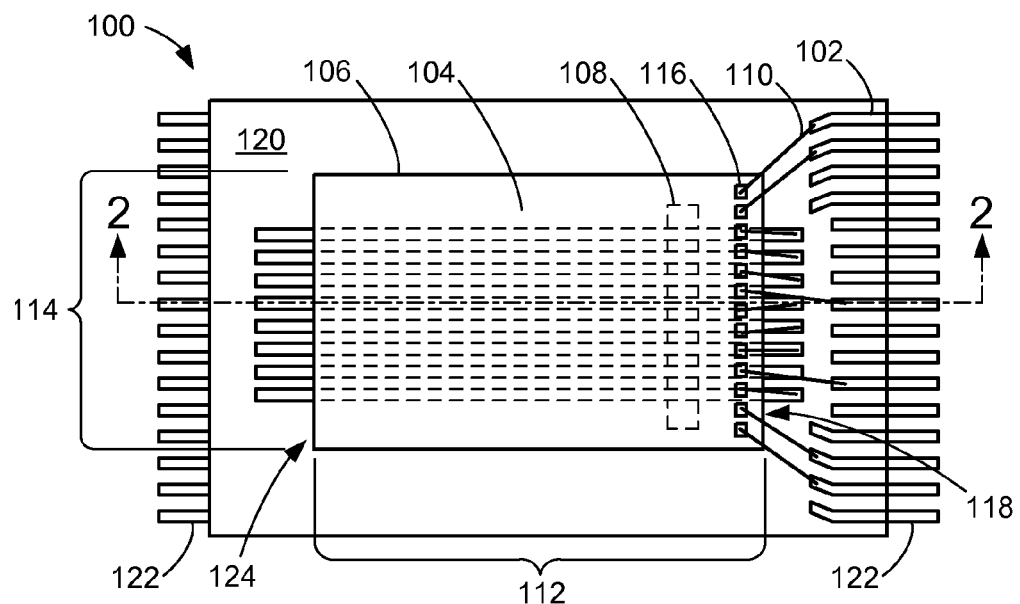
FIG. 1 is a plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a plan view of an integrated circuit package system 100 in a first embodiment of the present invention. Technologies such as Tape on leadframe Bottom (TOB) and Chip on Lead (COL) can be included in the integrated circuit package system 100. The integrated circuit package system 100 preferably includes leads 102 including long leads 104, an integrated circuit die 106, an adhesive layer 108, and electrical connectors 110.

The integrated circuit die 106 includes planar dimensions such as a die surface length 112 and a die surface width 114. The leads 102 can include one or more of the long leads 104 extended across one of the planar dimensions of the integrated circuit die 106. The long leads 104 provide a continuous surface for electrical connectivity, support for the adhesive layer 108, or support for the integrated circuit die 106.

The long leads 104 are formed having a length greater than one of the planar dimensions of the integrated circuit die 106 including the die surface length 112 or the die surface width 114. For illustrative purposes, the long leads 104 are shown extended across the die surface length 112 although it is understood that the long leads 104 can also extend across the die surface width 114.

The integrated circuit die 106 also includes die pads 116 such as bond pads or bump pads. The die pads 116 can be electrically connected to the leads 102 with the electrical connectors 110. For illustrative purposes, the die pads 116 are shown as formed near a die first edge 118 although it is understood that the die pads 116 can be formed anywhere on the integrated circuit die 106.

An encapsulant 120 can preferably be applied over the electrical connectors 110, the integrated circuit die 106, and the leads 102 including the long leads 104. The encapsulant 120 can be formed providing exposed lead surfaces 122 of the leads 102. The exposed lead surfaces 122 can be physically or electrically contiguous with any of the leads 102 including the long leads 104.

For example with a one-side-bond-pad chip, the leads 102 are formed from a bond-pad-opposite side such as a die second edge 124 to the bond pad side such as the die first edge 118 for possible wire bonding. These leads are underneath the integrated circuit die 106. The integrated circuit die 106 can be mounted or come to seat over the leads such as a Chip on Lead (COL) package.

In the above example, the adhesive layer 108 such as a tape can be attached over the bottom of the long leads 104 of a side opposite the integrated circuit die 106 to hold them and improve leadframe quality and improved condition of wire bonding. The adhesive layer 108 or optionally another adhesive layer (not shown) can bond the integrated circuit die 106 and can provide improved heat dissipation in part due to through conduction through the long leads 104.

Further to the above example, the adhesive layer 108 can include extruded portions of the adhesive layer 108 between the leads 102. The adhesive layer 108 can optionally cantilever or space the integrated circuit die 106 to the leads 102. The extruded portions of the adhesive layer 108 can provide a significantly lower profile die attach surface thereby providing a lower height package such as a package height compatible with a thin small outline package type I (TSOP-1).

It has been unexpectedly discovered that the integrated circuit package system 100 having the long leads 104 and the adhesive layer 108 provides improved structural integrity of the leads 102 including lead holding or holding of the leads, improved space for electrical connections, improved heat dissipation, and improved package height.

Figure 2:
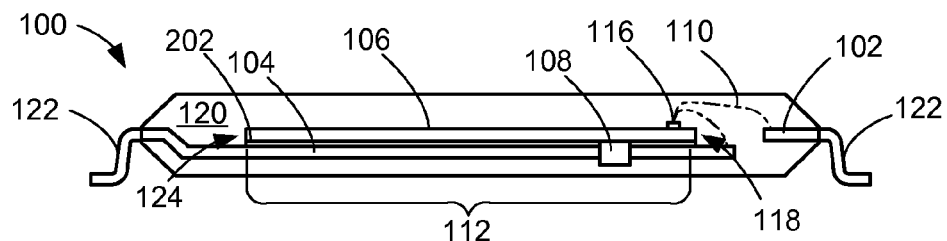
FIG. 2 is a cross-sectional view of the integrated circuit package system along a line 2-2 of FIG. 1.

Referring now to FIG. 2, therein is shown a cross-sectional view of the integrated circuit package system 100 along a line 2-2 of FIG. 1. The integrated circuit package system 100 preferably includes the leads 102 including the long leads 104, the integrated circuit die 106, the adhesive layer 108, and the electrical connectors 110 shown with phantom lines. The integrated circuit die 106 can be attached over the long leads 104 with a die attach layer 202 such as an adhesive or an adhesive film.

The integrated circuit die 106 includes planar dimensions such as the die surface length 112 and the die surface width 114 of FIG. 1. The leads 102 can include one or more of the long leads 104 extended across the die surface length 112 of the integrated circuit die 106. The long leads 104 provide a continuous surface for electrical connectivity, support for the adhesive layer 108, or support for the integrated circuit die 106.

The long leads 104 are formed having a length greater than one of the planar dimensions of the integrated circuit die 106 including the die surface length 112 or the die surface width 114. For illustrative purposes, the long leads 104 are shown extended across the die surface length 112 although it is understood that the long leads 104 can also extend across the die surface width 114.

The integrated circuit die 106 also includes the die pads 116 such as bond pads or bump pads. The die pads 116 can be electrically connected to the leads 102 with the electrical connectors 110. For illustrative purposes, the die pads 116 are shown as formed near the die first edge 118 although it is understood that the die pads 116 can be formed anywhere on the integrated circuit die 106.

The encapsulant 120 can preferably be applied over the electrical connectors 110, the integrated circuit die 106, and the leads 102 including the long leads 104. The encapsulant 120 can be formed providing the exposed lead surfaces 122 of the leads 102. The exposed lead surfaces 122 can be physically or electrically contiguous with any of the leads 102 including the long leads 104.

Figure 3:
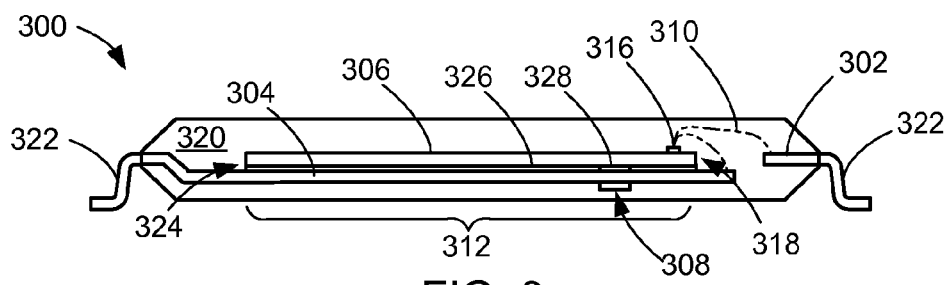
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes leads 302 including long leads 304, an integrated circuit die 306, an adhesive layer 308 such as solder, and electrical connectors 310 shown as phantom lines.

The adhesive layer 308 can optionally include lead finger slots (not shown). The integrated circuit die 306 can attach, mount, or bond to the adhesive layer 308 between the lead fingers and adjacent the lead finger slots. The lead finger slots can be formed having only a portion of height or thickness of the adhesive layer 308 for attaching, mounting, or bonding the integrated circuit die 306 thereby providing a lower height package.

The integrated circuit die 306 includes planar dimensions such as a die surface length 312 and a die surface width similar to the die surface width 114 of FIG. 1. The leads 302 can include one or more of the long leads 304 extended across one of the planar dimensions of the integrated circuit die 306. The long leads 304 provide a continuous surface for electrical connectivity, support for the adhesive layer 308, or support for the integrated circuit die 306.

The long leads 304 are formed having a length greater than one of the planar dimensions of the integrated circuit die 306 including the die surface length 312 or the die surface width. For illustrative purposes, the long leads 304 are shown extended across the die surface length 312 although it is understood that the long leads 304 can also extend across the die surface width.

The integrated circuit die 306 also includes die pads 316 such as bond pads or bump pads. The die pads 316 can be electrically connected to the leads 302 with the electrical connectors 310. For illustrative purposes, the die pads 316 are shown as formed near a die first edge 318 although it is understood that the die pads 316 can be formed anywhere on the integrated circuit die 306.

An encapsulant 320 can preferably be applied over the electrical connectors 310, the integrated circuit die 306, and the leads 302 including the long leads 304. The encapsulant 320 can be formed providing exposed lead surfaces 322 of the leads 302. The exposed lead surfaces 322 can be physically or electrically contiguous with any of the leads 302 including the long leads 304.

For example with a one-side-bond-pad chip, the leads 302 are formed from a bond-pad-opposite side such as a die second edge 324 to the bond pad side such as the die first edge 318 for possible wire bonding. These leads are underneath the integrated circuit die 306. The integrated circuit die 306 can be mounted or come to seat over the leads such as a Chip on Lead (COL) package.

In the above example, the adhesive layer 308 such as a tape can be attached over the bottom of the long leads 304 of a side opposite the integrated circuit die 306 to hold them and improve leadframe quality and improved condition of wire bonding. The adhesive layer 308 or optionally a die attach layer 326 such as an adhesive or an adhesive film can bond the integrated circuit die 306 and can provide improved heat dissipation in part due to through conduction through the long leads 304.

Further to the above example, the adhesive layer 308 can include adhesive layer extensions 328 of the adhesive layer 308 adjacent the lead finger slots formed to accommodate at least a portion of the leads 302. The adhesive layer 308 can optionally cantilever or space the integrated circuit die 306 to the leads 302. The extensions of the adhesive layer 308 adjacent the slots can provide a significantly smaller die attach height or thickness thereby providing a lower height package.

Figure 4:
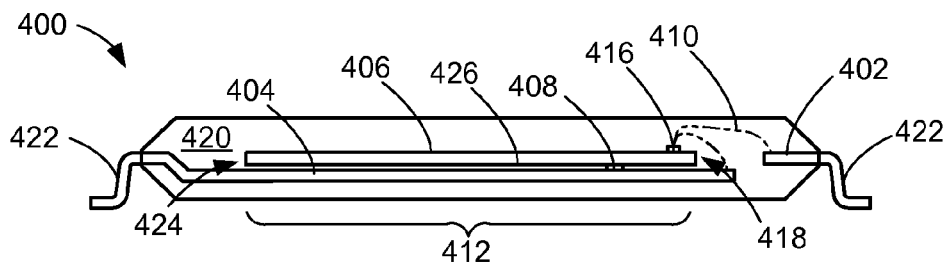
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes leads 402 including long leads 404, an integrated circuit die 406, an adhesive 408 such as solder or other conductive material, and electrical connectors 410 shown as phantom lines.

The adhesive 408 can optionally be formed in part of solder applied over the long leads 404. The integrated circuit die 406 can attach, mount, or bond to the adhesive 408 over the long leads 404. The adhesive 408 can be formed individually over each of a predetermined number of the long leads 404. Forming the adhesive 408 including solder can provide significantly greater heat dissipation in part due to heat conduction through the adhesive 408.

The integrated circuit die 406 includes planar dimensions such as a die surface length 412 and a die surface width similar to the die surface width 114 of FIG. 1. The leads 402 can include one or more of the long leads 404 extended across one of the planar dimensions of the integrated circuit die 406. The long leads 404 provide a continuous surface for electrical connectivity, support for the adhesive 408, or support for the integrated circuit die 406.

The long leads 404 are formed having a length greater than one of the planar dimensions of the integrated circuit die 406 including the die surface length 412 or the die surface width. For illustrative purposes, the long leads 404 are shown extended across the die surface length 412 although it is understood that the long leads 404 can also extend across the die surface width.

The integrated circuit die 406 also includes die pads 416 such as bond pads or bump pads. The die pads 416 can be electrically connected to the leads 402 with the electrical connectors 410. For illustrative purposes, the die pads 416 are shown as formed near a die first edge 418 although it is understood that the die pads 416 can be formed anywhere on the integrated circuit die 406.

An encapsulant 420 can preferably be applied over the electrical connectors 410, the integrated circuit die 406, and the leads 402 including the long leads 404. The encapsulant 420 can be formed providing exposed lead surfaces 422 of the leads 402. The exposed lead surfaces 422 can be physically or electrically contiguous with any of the leads 402 including the long leads 404.

For example with a one-side-bond-pad chip, the leads 402 are formed from a bond-pad-opposite side such as a die second edge 424 to the bond pad side such as the die first edge 418 for possible wire bonding. These leads are underneath the integrated circuit die 406. The integrated circuit die 406 can be mounted or come to seat over the leads.

In the above example, the adhesive 408 can be attached individually over each of a predetermined number of the long leads 404. The adhesive 408 or optionally a die attach layer 426 such as an adhesive or an adhesive film can bond the integrated circuit die 406 and can provide improved heat dissipation in part due to conduction through the adhesive 408 and the long leads 404.

Further to the above example, the adhesive 408 can be formed individually having a smaller size and thereby a lower height or thickness. The adhesive 408 can optionally cantilever or space the integrated circuit die 406 to the leads 402. The adhesive 408 formed over individual locations of the long leads 404 can provide a significantly smaller die attach height or thickness thereby providing a lower height package.

Figure 5:
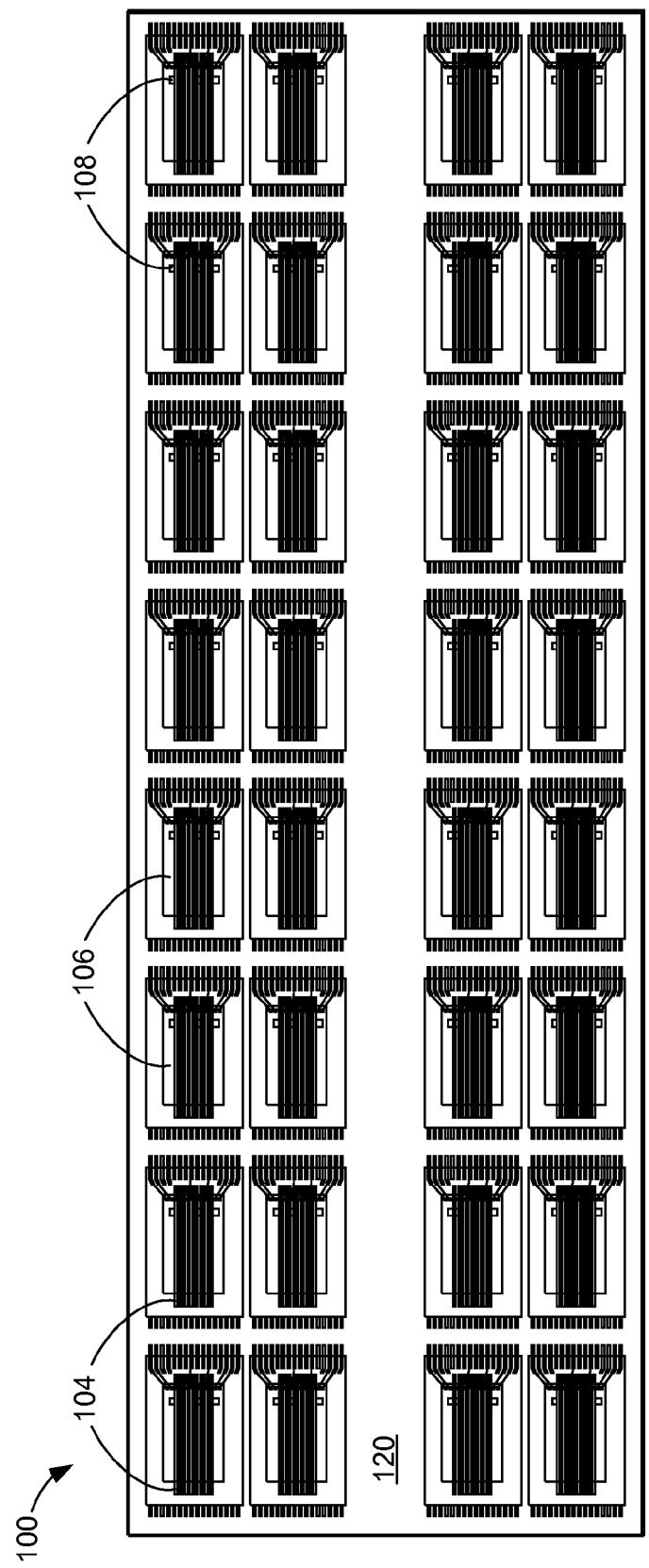
FIG. 5 is a bottom view of the integrated circuit package system in an encapsulation phase.

Referring now to FIG. 5, therein is shown a bottom view of the integrated circuit package system 100 in an encapsulation phase. The integrated circuit package system 100 preferably includes the leads 102 including the long leads 104, the integrated circuit die 106, and the adhesive layer 108.

The adhesive layer 108 can be attached over the bottom of the long leads 104 to hold the long leads 104 and improve the quality of the long leads such as planarity and spacing. The adhesive layer 108 can also improve the condition of the electrical connectors 110 of FIG. 1.

For example, the integrated circuit package system 100 is shown as formed in an array. The encapsulant 120 can be applied over the array of the integrated circuit package system 100 to provide structural integrity and protection for the leads 102 including the long leads 104, the integrated circuit die 106, and the adhesive layer 108.

Figure 6:
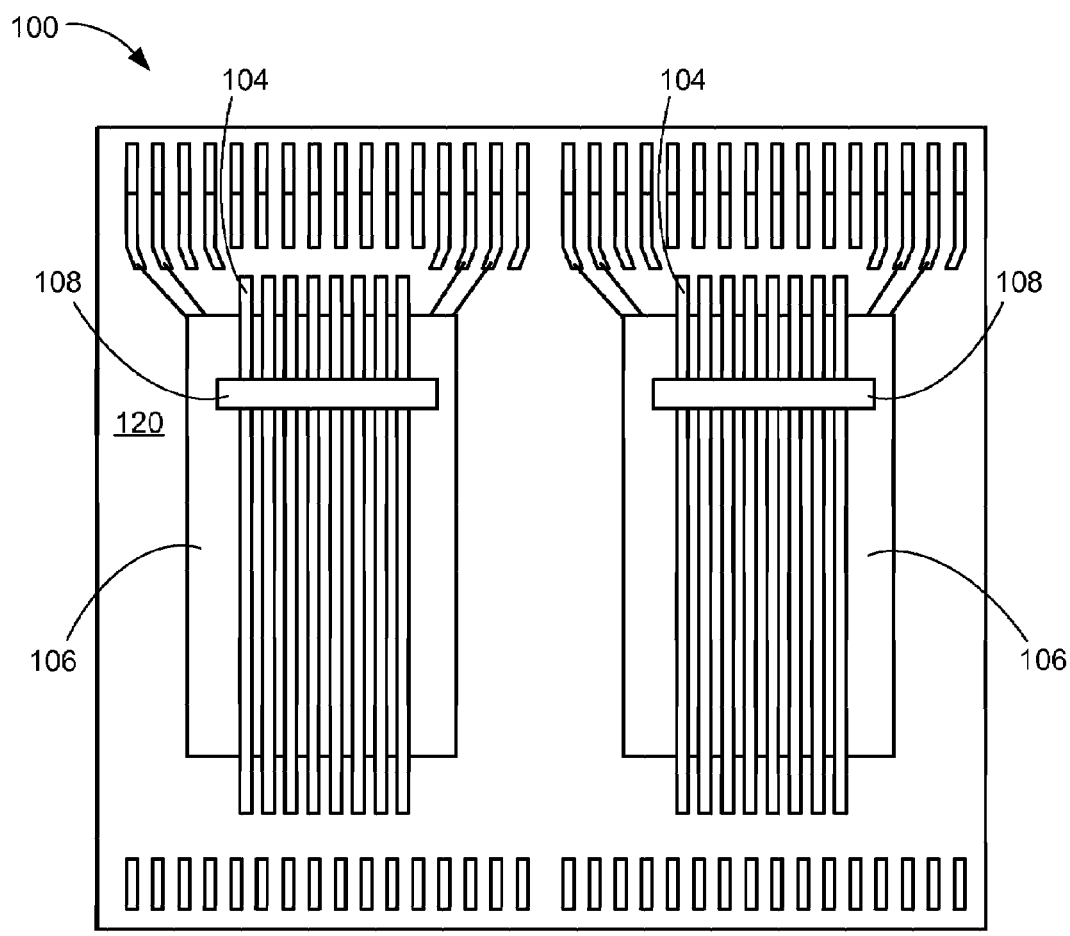
FIG. 6 is a bottom view of the structure of FIG. 5 in a more detailed view.

Referring now to FIG. 6, therein is shown a bottom view of the structure of FIG. 5 in a more detailed view. The integrated circuit package system 100 preferably includes the leads 102 including the long leads 104, the integrated circuit die 106, the adhesive layer 108, and the encapsulant 120.

Substantially the same as in FIG. 5, the integrated circuit package system 100 is shown as formed in the array. The integrated circuit package system 100 eliminates of delamination between the encapsulant 120 and the adhesive layer 108 as well as eliminates delamination between the encapsulant 120 and the leads 102.

Figure 7:
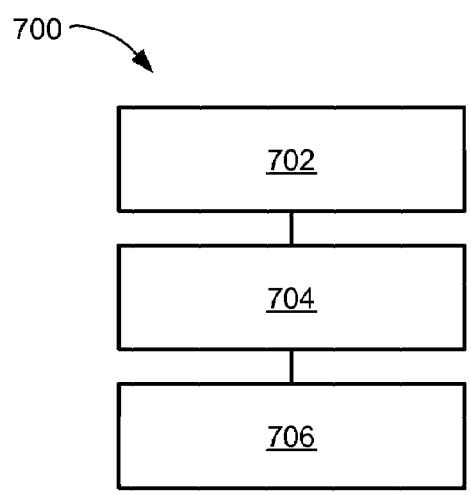
FIG. 7 is a flow chart of an integrated circuit package system for manufacturing the integrated circuit package system in an embodiment of the present invention.

Referring now to FIG. 7, therein is shown a flow chart of an integrated circuit package system 700 for manufacturing the integrated circuit package system 100 in an embodiment of the present invention. The system 700 includes providing an integrated circuit die having planar dimensions in a block 702; forming a lead extended across one of the planar dimensions of the integrated circuit die in a block 704; and applying an adhesive layer over the lead of a side opposite the integrated circuit die in a block 706.

In greater detail, a system to provide the method and apparatus of the integrated circuit package system 100, in an embodiment of the present invention, is performed as follows:

1. Providing an integrated circuit die having a die surface length and a die surface width.
2. Forming leads including a long lead extended across the die surface length or the die surface width.
3. Applying an adhesive layer over the leads of a side opposite the integrated circuit die.
4. Attaching electrical connectors to the integrated circuit die mounted over the leads and the adhesive layer.

Thus, it has been discovered that the method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing an integrated circuit die having planar dimensions;
   forming leads extended across one of the planar dimensions of the integrated circuit die; and
   applying an adhesive layer over the leads of a side opposite the integrated circuit die, the adhesive layer directly bonded to the integrated circuit die.

2. The system as claim 1 wherein forming the lead includes forming the lead extended across a die surface length or a die surface width.

3. The system as claimed in claim 1 wherein applying the adhesive layer includes providing the integrated circuit die cantilevered.

4. The system as claimed in claim 1 wherein applying the adhesive layer includes applying an adhesive tape.

5. The system as claimed in claim 1 wherein applying the adhesive layer includes applying a solder.

6. An integrated circuit package system comprising:
   providing an integrated circuit die having a die surface length and a die surface width;
   forming leads including a long lead extended across the die surface length or the die surface width;
   applying an adhesive layer over the leads of a side opposite the integrated circuit die, the adhesive layer directly bonded to the integrated circuit die; and
   attaching electrical connectors to the leads and the integrated circuit die mounted over the leads and the adhesive layer.

7. The system as claimed in claim 6 wherein forming the lead includes forming the lead having a length greater than the die surface length or the die surface width.

8. The system as claimed in claim 6 wherein applying the adhesive layer includes providing the integrated circuit die cantilevered or spaced to the leads.

9. The system as claimed in claim 6 wherein applying the adhesive layer includes applying an adhesive tape having an adhesive layer extension.

10. The system as claimed in claim 6 wherein applying the adhesive layer includes applying a solder individually over the long lead.

11. An integrated circuit package system comprising:
    an integrated circuit die having planar dimensions;
    leads extended across one of the planar dimensions of the integrated circuit die; and
    an adhesive layer over the leads of a side opposite the integrated circuit die, the adhesive layer directly bonded to the integrated circuit die.

12. The system as claimed in claim 11 wherein the lead is extended across the die surface length or the die surface width.

13. The system as claimed in claim 11 wherein the adhesive layer includes the integrated circuit die cantilevered.

14. The system as claimed in claim 11 wherein the adhesive layer is an adhesive tape.

15. The system as claimed in claim 11 wherein the adhesive layer is a solder.

16. The system as claimed in claim 11 wherein:
    the integrated circuit die has a die surface length and a die surface width;
    the lead is leads including a long lead extended across the die surface length or the die surface width;
    the adhesive layer is over the leads of a side opposite the integrated circuit die; and
    further comprising:
    electrical connectors attached to the leads and the integrated circuit die mounted over the leads and the adhesive layer.

17. The system as claimed in claim 16 wherein the lead has a length greater than the die surface length or the die surface width.

18. The system as claimed in claim 16 wherein the adhesive layer includes the integrated circuit die cantilevered or spaced to the leads.

19. The system as claimed in claim 16 wherein the adhesive layer is an adhesive tape having an adhesive layer extension.

20. The system as claimed in claim 16 wherein the adhesive layer is a solder applied individually over the long lead.

* * * * *